(12) United States Patent
Huang et al.

(10) Patent No.: US 9,349,699 B2
(45) Date of Patent: May 24, 2016

(54) FRONT SIDE COPPER POST JOINT STRUCTURE FOR TEMPORARY BOND IN TSV APPLICATION

(71) Applicant: Taiwan Semiconductor Manufacturing Company, Ltd., Hsin-Chu (TW)

(72) Inventors: Hon-Lin Huang, Hsin-Chu (TW);
Ching-Wen Hsiao, Hsin-Chu (TW);
Kuo-Ching Hsu, Chung-Ho (TW);
Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/257,734

(22) Filed: Apr. 21, 2014

(65) Prior Publication Data
US 2014/0227831 A1    Aug. 14, 2014

Related U.S. Application Data

(62) Division of application No. 12/831,819, filed on Jul. 7, 2010, now Pat. No. 8,736,050.

(60) Provisional application No. 61/239,641, filed on Sep. 3, 2009.

(51) Int. Cl.
*H01L 23/00* (2006.01)
*H01L 23/31* (2006.01)
*H01L 23/48* (2006.01)

(52) U.S. Cl.
CPC .............. *H01L 24/11* (2013.01); *H01L 24/13* (2013.01); *H01L 24/81* (2013.01);
(Continued)

(58) Field of Classification Search
CPC .............. H01L 2924/00014; H01L 2924/00; H01L 2924/0002; H01L 2924/014; H01L 2224/13147; H01L 2924/01047; H01L 2924/01029; H01L 2224/13099; H01L 23/481; H01L 2924/01082; H01L 2924/01079; H01L 2924/01033; H01L 2924/01078; H01L 2924/19041; H01L 2924/01013; H01L 2924/14
USPC .......... 257/621, E23.011, 737; 438/667, 613, 438/614, 622
See application file for complete search history.

(56) References Cited

U.S. PATENT DOCUMENTS 3,461,357 A  8/1969  Mutter et al.
4,005,472 A  1/1977  Harris et al.
(Continued)

FOREIGN PATENT DOCUMENTS

JP   2000188357   7/2000
JP   2001257310   9/2001
(Continued)

OTHER PUBLICATIONS

Shen, L.-C., et al., "A Clamped Through Silicon Via (TSV) Interconnection for Stacked Chip Bonding Using Metal Cap on Pad and Metal Column Forming in Via," 2008, IEEE, pp. 544-549.

*Primary Examiner* — David Vu
*Assistant Examiner* — Jonathan Han
(74) *Attorney, Agent, or Firm* — Slater Matsil, LLP

(57) ABSTRACT

A method of forming an integrated circuit structure is provided. The method includes providing a substrate, the substrate having a conductive pad thereon. A dielectric buffer layer is formed over at least a portion of the conductive pad, and an under-bump-metallurgy (UBM) is formed directly coupled to the conductive pad, wherein the UBM extends over at least a portion of the dielectric buffer layer. Thereafter, a conductive pillar is formed over the UBM, and one or more conductive materials are formed over the conductive pillar. The substrate may be attached to a carrier substrate using an adhesive.

20 Claims, 11 Drawing Sheets

(52) U.S. Cl.
CPC .......... *H01L 23/3157* (2013.01); *H01L 23/481* (2013.01); *H01L 2221/68327* (2013.01); *H01L 2221/68359* (2013.01); *H01L 2224/0401* (2013.01); *H01L 2224/05558* (2013.01); *H01L 2224/05572* (2013.01); *H01L 2224/119* (2013.01); *H01L 2224/1147* (2013.01); *H01L 2224/11823* (2013.01); *H01L 2224/11849* (2013.01); *H01L 2224/11912* (2013.01); *H01L 2224/131* (2013.01); *H01L 2224/13027* (2013.01); *H01L 2224/1357* (2013.01); *H01L 2224/13083* (2013.01); *H01L 2224/13099* (2013.01); *H01L 2224/13111* (2013.01); *H01L 2224/13147* (2013.01); *H01L 2224/13155* (2013.01); *H01L 2224/13562* (2013.01); *H01L 2224/13611* (2013.01); *H01L 2224/818* (2013.01); *H01L 2924/0002* (2013.01); *H01L 2924/00014* (2013.01); *H01L 2924/014* (2013.01); *H01L 2924/01013* (2013.01); *H01L 2924/01022* (2013.01); *H01L 2924/01023* (2013.01); *H01L 2924/01027* (2013.01); *H01L 2924/01029* (2013.01); *H01L 2924/01033* (2013.01); *H01L 2924/01046* (2013.01); *H01L 2924/01047* (2013.01); *H01L 2924/01073* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/01327* (2013.01); *H01L 2924/04953* (2013.01); *H01L 2924/14* (2013.01); *H01L 2924/19041* (2013.01)

(56) References Cited

U.S. PATENT DOCUMENTS

| | | | |
|---|---|---|---|
| 5,136,364 A | 8/1992 | Byrne | |
| 5,391,917 A | 2/1995 | Gilmour et al. | |
| 5,510,298 A | 4/1996 | Redwine | |
| 5,767,001 A * | 6/1998 | Bertagnolli | H01L 21/76898 257/E21.597 |
| 5,897,362 A | 4/1999 | Wallace | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,376,332 B1 | 4/2002 | Yanagita et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,566,239 B2 | 5/2003 | Makino et al. | |
| 6,599,778 B2 | 7/2003 | Pogge et al. | |
| 6,630,736 B1 | 10/2003 | Ignaut | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,765,299 B2 | 7/2004 | Takahashi et al. | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,897,125 B2 | 5/2005 | Morrow et al. | |
| 6,924,551 B2 | 8/2005 | Rumer et al. | |
| 6,936,923 B2 | 8/2005 | Lin et al. | |
| 6,958,546 B2 | 10/2005 | Fan et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,055,121 B1 | 5/2006 | Bolander et al. | |
| 7,060,601 B2 | 6/2006 | Savastiouk et al. | |
| 7,071,546 B2 | 7/2006 | Fey et al. | |
| 7,095,116 B1 | 8/2006 | Kelkar et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,271,483 B2 | 9/2007 | Lin et al. | |
| 7,291,542 B2 | 11/2007 | Iwamatsu et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,355,279 B2 | 4/2008 | Ke et al. | |
| 7,371,663 B2 | 5/2008 | Chen et al. | |
| 7,378,732 B2 | 5/2008 | Yamano et al. | |
| 7,417,326 B2 | 8/2008 | Ikumo et al. | |
| 7,465,653 B2 | 12/2008 | Huang et al. | |
| 7,524,753 B2 | 4/2009 | Sunohara et al. | |
| 7,569,935 B1 | 8/2009 | Fan | |
| 7,713,861 B2 | 5/2010 | Yu | |
| 7,786,584 B2 | 8/2010 | Barth et al. | |
| 7,804,177 B2 | 9/2010 | Lu et al. | |
| 7,838,337 B2 | 11/2010 | Marimuthu et al. | |
| 7,863,739 B2 | 1/2011 | Lee et al. | |
| 7,863,740 B2 | 1/2011 | Ke et al. | |
| 7,902,679 B2 | 3/2011 | Lin et al. | |
| 7,928,534 B2 | 4/2011 | Hsu et al. | |
| 7,936,075 B2 | 5/2011 | Eda | |
| 7,939,858 B2 | 5/2011 | Nakanishi | |
| 7,956,442 B2 | 6/2011 | Hsu et al. | |
| 7,977,771 B2 | 7/2011 | Higuchi | |
| 8,022,543 B2 | 9/2011 | Farooq et al. | |
| 8,097,964 B2 | 1/2012 | West et al. | |
| 8,158,489 B2 | 4/2012 | Huang et al. | |
| 8,264,077 B2 * | 9/2012 | Chiou et al. | 257/698 |
| 8,288,872 B2 | 10/2012 | Chen et al. | |
| 8,411,459 B2 | 4/2013 | Yu et al. | |
| 8,420,522 B2 | 4/2013 | Ikumo et al. | |
| 8,461,045 B2 | 6/2013 | Hsu et al. | |
| 8,631,366 B2 | 1/2014 | Hou et al. | |
| 8,736,050 B2 | 5/2014 | Huang et al. | |
| 8,759,949 B2 | 6/2014 | Yu et al. | |
| 2002/0121692 A1 | 9/2002 | Lee et al. | |
| 2003/0127734 A1 | 7/2003 | Lee et al. | |
| 2004/0151917 A1 | 8/2004 | Chen et al. | |
| 2004/0268288 A1 | 12/2004 | Bajuk et al. | |
| 2005/0037153 A1 | 2/2005 | Schmitt et al. | |
| 2005/0044522 A1 | 2/2005 | Maeda | |
| 2005/0176235 A1 | 8/2005 | Noma et al. | |
| 2005/0212133 A1 | 9/2005 | Barnak et al. | |
| 2005/0236693 A1 | 10/2005 | Kroninger et al. | |
| 2006/0014320 A1 | 1/2006 | Yamano et al. | |
| 2006/0046431 A1 | 3/2006 | Blietz et al. | |
| 2006/0099791 A1 | 5/2006 | Mitani et al. | |
| 2006/0138464 A1 | 6/2006 | Shimamura | |
| 2006/0190908 A1 | 8/2006 | Bajuk et al. | |
| 2006/0253810 A1 | 11/2006 | Guardiani et al. | |
| 2007/0102815 A1 | 5/2007 | Kaufmann et al. | |
| 2007/0164317 A1 | 7/2007 | Nakanishi | |
| 2007/0210259 A1 | 9/2007 | Kerwin et al. | |
| 2008/0023850 A1 | 1/2008 | Lu et al. | |
| 2008/0035854 A1 | 2/2008 | Jin et al. | |
| 2008/0054459 A1 | 3/2008 | Lee et al. | |
| 2008/0057678 A1 | 3/2008 | Gadkaree et al. | |
| 2008/0079121 A1 | 4/2008 | Han | |
| 2008/0083985 A1 | 4/2008 | Lee et al. | |
| 2008/0131679 A1 | 6/2008 | Nakai et al. | |
| 2008/0258299 A1 | 10/2008 | Kang et al. | |
| 2009/0098724 A1 | 4/2009 | Yu | |
| 2009/0102021 A1 | 4/2009 | Chen et al. | |
| 2009/0140381 A1 | 6/2009 | Lin et al. | |
| 2009/0160058 A1 * | 6/2009 | Kuo et al. | 257/758 |
| 2009/0224375 A1 | 9/2009 | Eda | |
| 2009/0267213 A1 * | 10/2009 | Lin | H01L 23/49816 257/687 |
| 2009/0289308 A1 | 11/2009 | Nakanishi | |
| 2009/0309235 A1 * | 12/2009 | Suthiwongsunthorn et al. | 257/777 |
| 2009/0319977 A1 | 12/2009 | Saxena et al. | |
| 2010/0009318 A1 | 1/2010 | Kim | |

(56) References Cited

U.S. PATENT DOCUMENTS

| | | |
|---|---|---|
| 2010/0013102 A1 | 1/2010 | Tay et al. |
| 2010/0022034 A1 | 1/2010 | Antol et al. |
| 2010/0090318 A1* | 4/2010 | Hsu et al. .................. 257/621 |
| 2010/0090319 A1 | 4/2010 | Hsu et al. |
| 2010/0155783 A1 | 6/2010 | Law et al. |
| 2010/0224966 A1 | 9/2010 | Chen |
| 2010/0244241 A1* | 9/2010 | Marimuthu ........... H01L 21/561 257/737 |
| 2010/0252934 A1 | 10/2010 | Law et al. |
| 2010/0276787 A1 | 11/2010 | Yu et al. |
| 2010/0320575 A9 | 12/2010 | Chauhan |
| 2010/0330798 A1 | 12/2010 | Huang et al. |
| 2011/0049706 A1 | 3/2011 | Huang et al. |
| 2011/0061037 A1 | 3/2011 | Croysdale et al. |
| 2011/0165776 A1 | 7/2011 | Hsu et al. |
| 2011/0186990 A1 | 8/2011 | Mawatari et al. |
| 2011/0193235 A1 | 8/2011 | Hu et al. |
| 2011/0233785 A1 | 9/2011 | Koester et al. |
| 2011/0248404 A1 | 10/2011 | Chiu et al. |
| 2011/0291259 A9 | 12/2011 | Huang et al. |
| 2013/0174417 A1 | 7/2013 | Yu Chen-Hua et al. |

FOREIGN PATENT DOCUMENTS

| | | |
|---|---|---|
| JP | 2002190550 | 7/2002 |
| JP | 2004319707 | 11/2004 |
| JP | 2006351968 | 12/2006 |
| JP | 2007067211 | 3/2007 |
| JP | 2008258445 | 10/2008 |

* cited by examiner

FRONT SIDE COPPER POST JOINT STRUCTURE FOR TEMPORARY BOND IN TSV APPLICATION

This application claims the benefit of U.S. Provisional Application No. 61/239,641 filed on Sep. 3, 2009, entitled "Front Side Copper Post Joint Structure for Temporary Bond in TSV Application," and U.S. patent application Ser. No. 12/831,819 filed on Jul. 1, 2010, entitled "Front Side Copper Post Joint Structure for Temporary Bond in TSV Application," which applications are hereby incorporated herein by reference.

CROSS-REFERENCES TO RELATED APPLICATIONS

This application relates to the following commonly-assigned U.S. patent application Ser. No. 12/332,934, filed Dec. 11, 2008, and entitled "Backside Connection to TSVs Having Redistribution Lines;" and application Ser. No. 12/347,742, filed Dec. 31, 2008, and entitled "Bond Pad Connection to Redistribution Lines Having Tapered Profiles," which applications are hereby incorporated herein by reference.

TECHNICAL FIELD

This disclosure relates generally to integrated circuit structures, and more particularly to interconnect structures in the integrated circuit structures.

BACKGROUND

Since the manufacturing of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and lengths of interconnections between devices as the number of devices increases. When the number and the lengths of interconnections increase, both circuit RC delay and power consumption increase.

Among the efforts for resolving the above-discussed limitations, three-dimensional integrated circuits (3D ICs) and stacked dies are commonly used. Through-substrate vias (TSVs) are thus used in 3D ICs and stacked dies for connecting dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

BRIEF DESCRIPTION OF THE DRAWINGS

For a more complete understanding of the disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments.

A novel interconnect structure and the method of forming the same are presented in accordance with an embodiment. The intermediate stages of manufacturing the embodiment are illustrated. The variations of the embodiment are then discussed. Throughout the various views and illustrative embodiments, like reference numbers are used to designate like elements.

Figure 1:
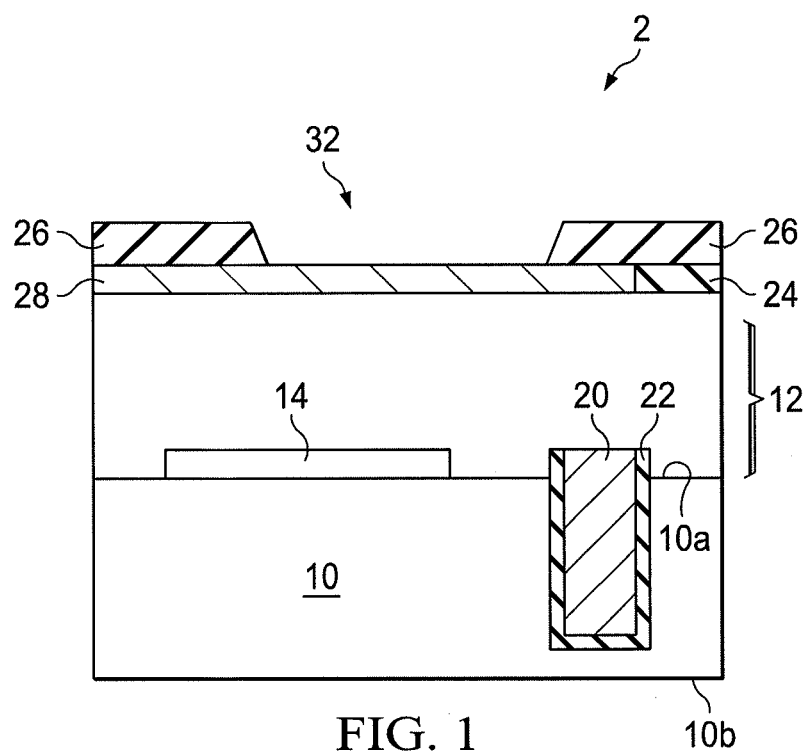
FIGS. 1 through 9 are cross-sectional views of intermediate stages in the manufacturing of a front side interconnect structure in accordance with an embodiment.

Referring to FIG. 1, wafer 2, which includes substrate 10, is provided. Wafer 2 has a front side (facing up) and a backside. Substrate 10 is a semiconductor substrate such as a bulk silicon substrate, although it may include other semiconductor materials such as group III, group IV, and/or group V elements. Semiconductor devices 14, such as transistors, may be formed at the front surface/side 10a (the surface 10a facing up in FIG. 1) of substrate 10. Interconnect structure 12, which includes metal lines and vias (not shown) formed therein, is formed under substrate 10 and may be connected to semiconductor devices 14. The metal lines and vias may be formed of copper or copper alloys, and may be formed using the well-known damascene processes. Interconnect structure 12 may include commonly known inter-layer dielectric (ILD) and inter-metal dielectrics (IMDs).

Through-substrate via (TSV) 20 extends from front surface 10a of substrate 10 into substrate 10. In a first embodiment, TSV 20 is formed using a via-first approach, and is formed before the formation of interconnect structure 12. Accordingly, TSV 20 only extends to the ILD that is used to cover the active devices, but not into the IMD layers in interconnect structure 12. In alternative embodiments, TSV 20 is formed using a via-last approach, and is formed after the formation of interconnect structure 12. Accordingly, TSV 20 penetrates into both substrate 10 and interconnect structure 12. Isolation layer 22 is formed on the sidewalls and bottom of TSV 20, and electrically insulates TSV 20 from substrate 10. Isolation layer 22 may be formed of commonly used dielectric materials such as silicon nitride, silicon oxide (for example, tetraethyl-ortho-silicate (TEOS) oxide), and the like.

Passivation layers 24 and 26 are formed over interconnect structure 12. Passivation layers 24 and 26 are commonly referred to in the art as being passivation-1 and passivation-2, respectively, and may be formed of materials such as silicon oxide, silicon nitride, un-doped silicate glass (USG), polyimide, and/or multi-layers thereof. Metal pad 28 is formed over passivation layer 24. Metal pad 28 may be formed of aluminum, and hence may also be referred to as aluminum pad 28, although it may also be formed of, or include, other materials such as copper, silver, gold, nickel, tungsten, alloys thereof, and/or multi-layers thereof. Metal pad 28 may be electrically connected to semiconductor devices 14, for example, through underlying interconnection structure 12. Opening 32 is formed in passivation layer 26, with metal pad 28 exposed through opening 32.

Figure 2:
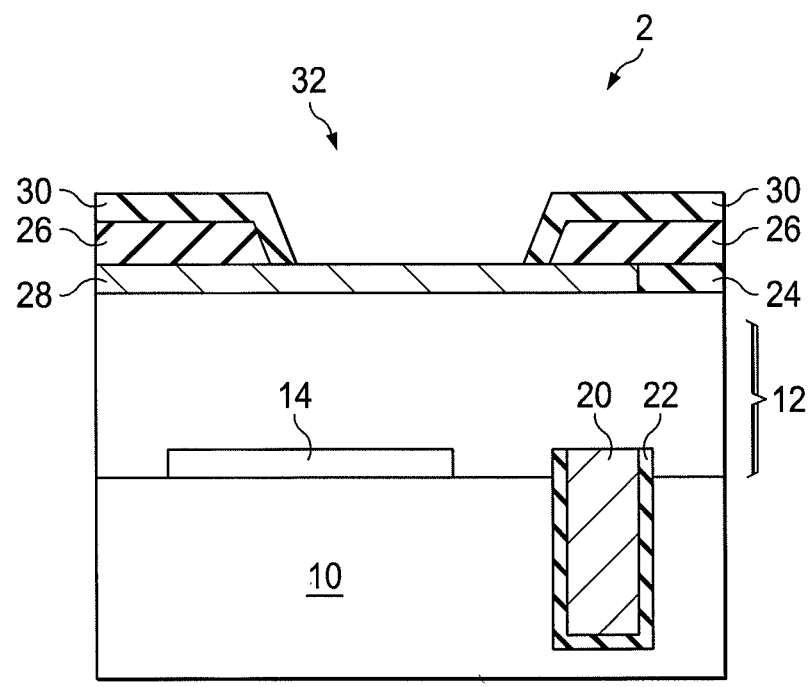

Referring to FIG. 2, dielectric buffer layer 30, which may be formed of polyimide, is formed. Dielectric buffer layer 30 is patterned to form an additional opening in opening 32, so that metal pad 28 is exposed through opening 32 and the additional opening in dielectric buffer layer 30.

Figure 3:
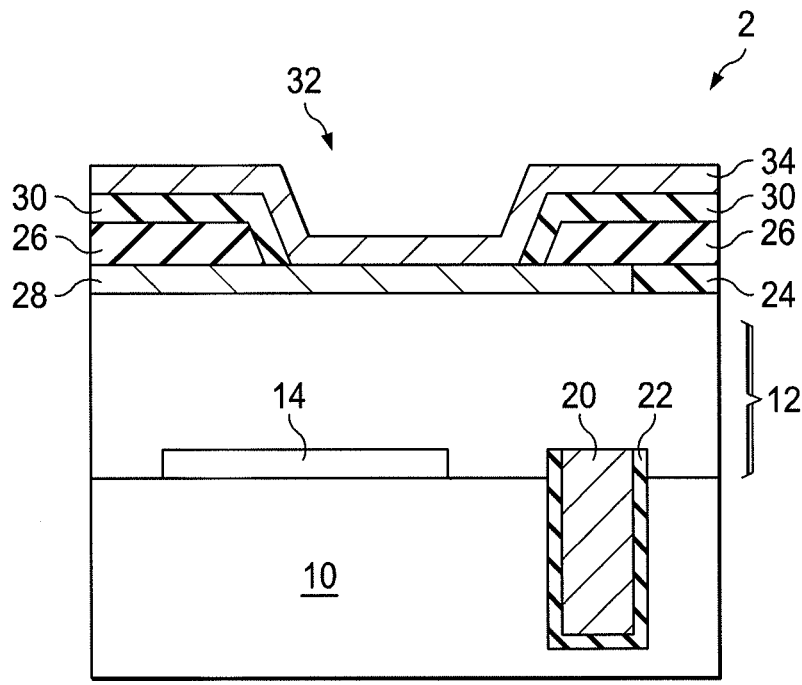

Referring to FIG. 3, an under-bump metallurgy (UBM) 34, is formed. The usable materials of UBM 34 include a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, UBM 34 is formed using sputtering. In other embodiments, electro plating may be used.

Figure 4:
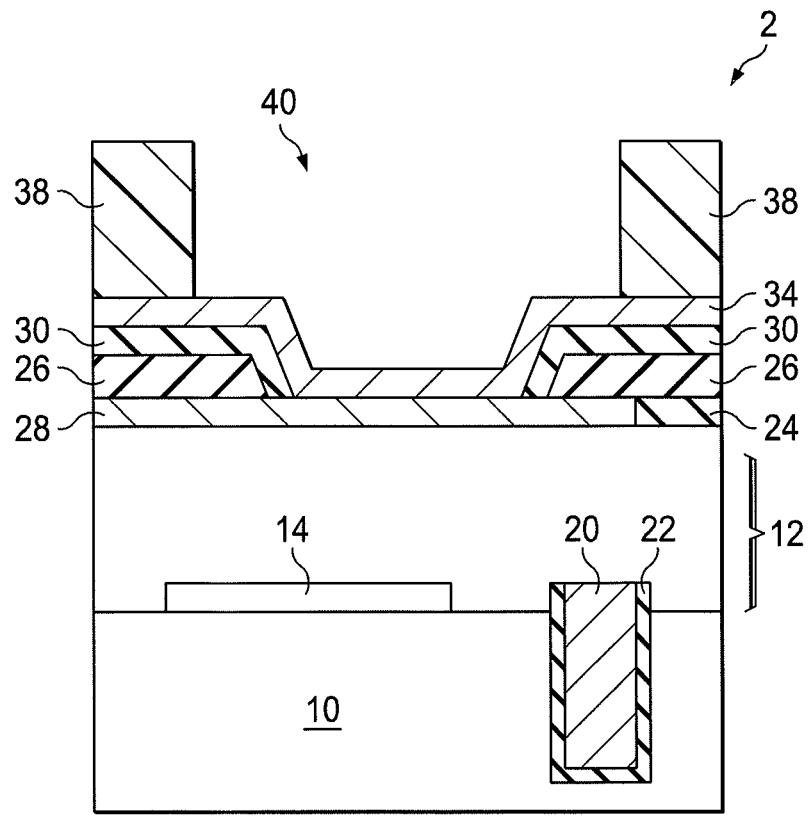

FIG. 4 illustrates the formation of mask 38. In an embodiment, mask 38 is a dry film, which may include an organic material such as Ajinimoto buildup film (ABF). Alternatively, mask 38 is formed of photo resist. Mask 38 is then patterned to form opening 40, wherein metal pad 28 is under opening 40.

Figure 5:
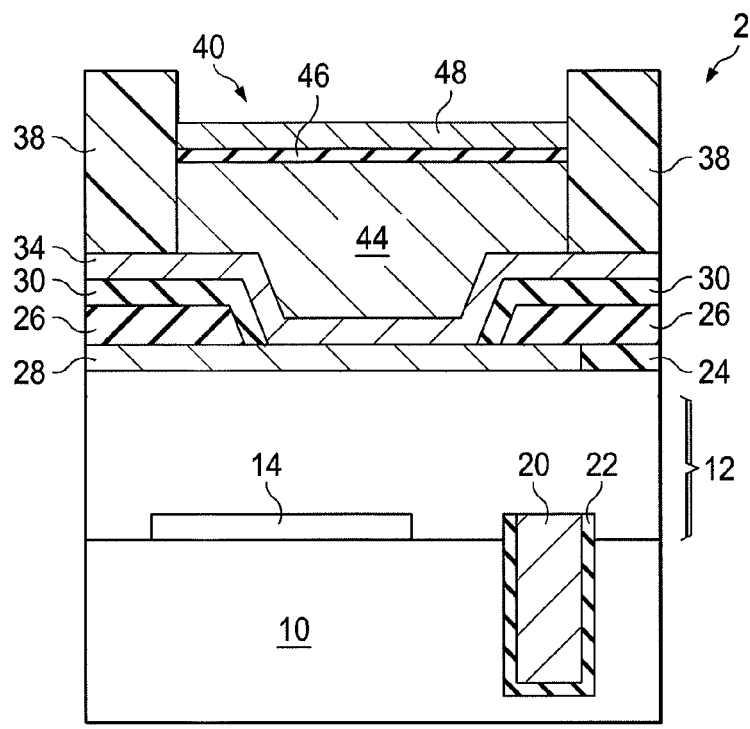

In FIG. 5, opening 40 is filled selectively with a metallic material, forming metal post 44 in opening 40. In an embodiment, the filling material includes copper or copper alloys, and hence metal post 44 is also referred to as copper post 44, although other metals, such as aluminum, silver, gold, and combinations thereof, may also be used. Copper post 44 may have a thickness less than about 60 µm, or even between about 30 µm and about 50 µm. The edge of the copper post may be vertical, or in other words, perpendicular to the top surface of semiconductor substrate 10. Next, conductive barrier layer 46, which may be formed of a nickel-containing layer, a copper-containing layer, or a tin-containing layer, is formed. Solder 48, which may comprise a lead-free solder or a eutectic solder, is then formed. Solder 48 may have a thickness less than about 15 µm. The formation methods of copper post 44, conductive barrier layer 46, and solder 48 include electro-chemical plating (ECP), electroless plating, or other commonly used deposition methods such as sputtering, printing, and chemical vapor deposition (CVD) methods. The top surface of solder 48 may be lower than the top surface of mask 38, so that the edges of copper post 44, conductive barrier layer 46, and solder 48 are vertically aligned, and the edges of solder 48 do not extend beyond the edges of copper post 44.

Figure 6:
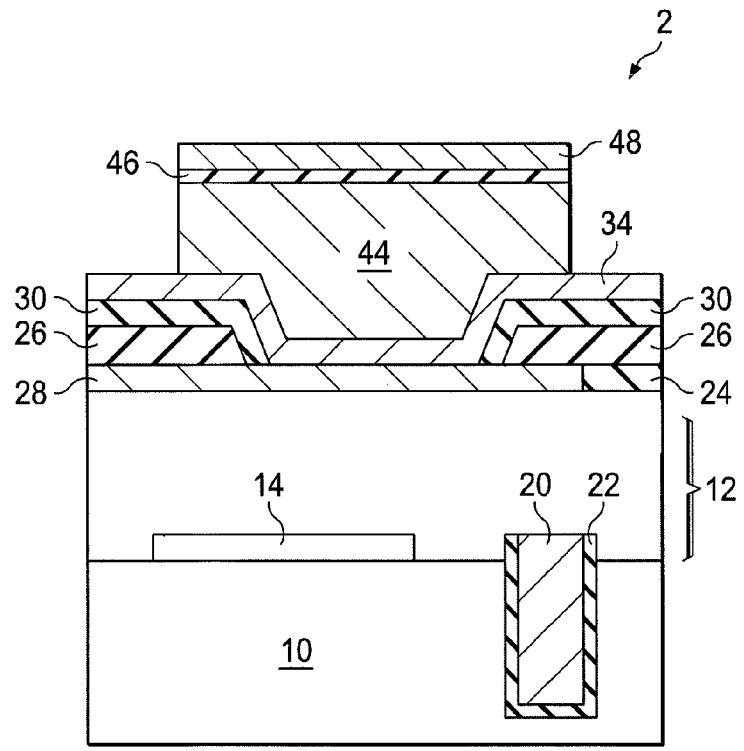
Figure 7:
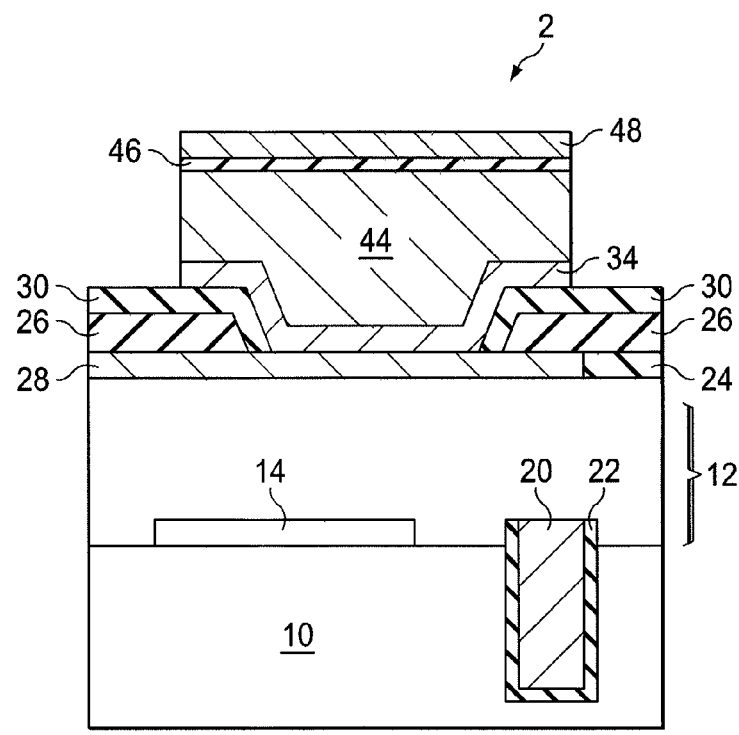
Figure 8A:
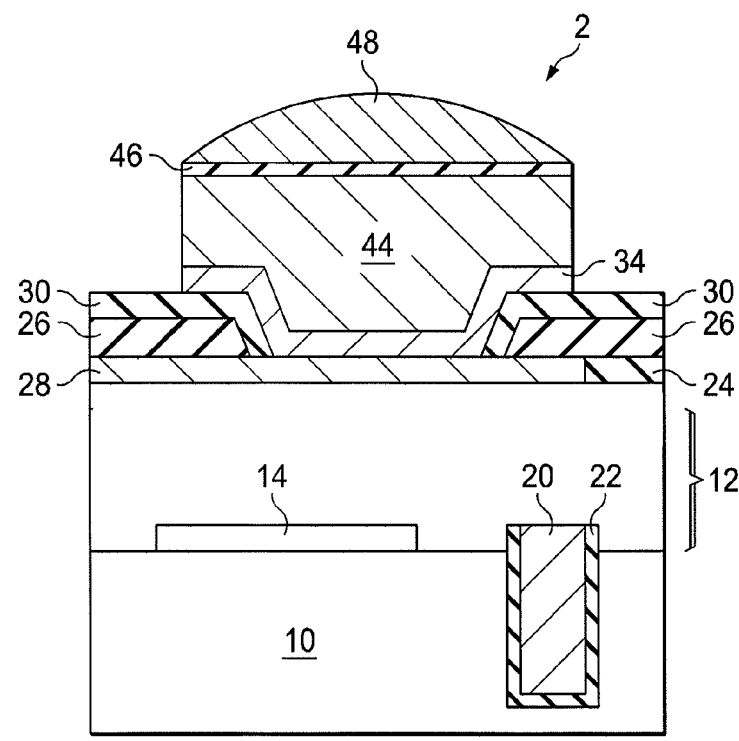
Figure 8B:
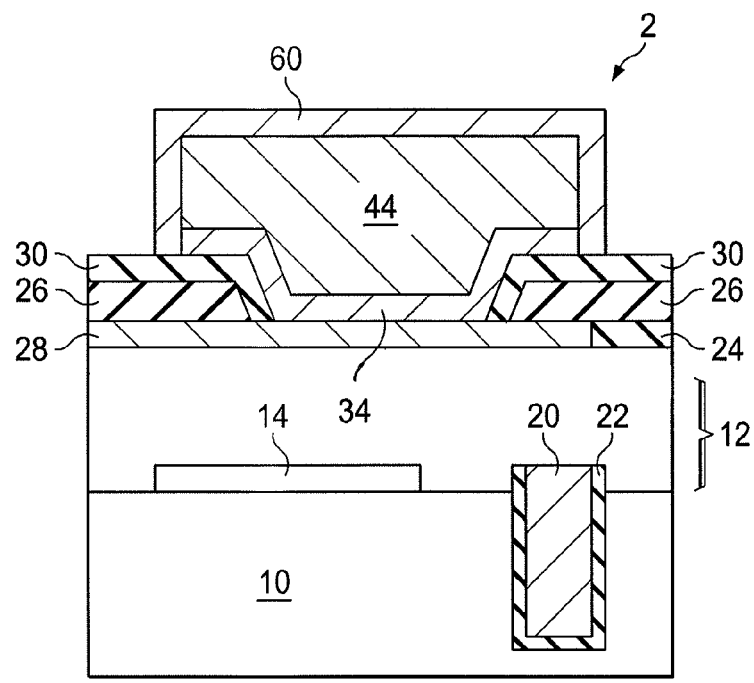
Figure 8C:
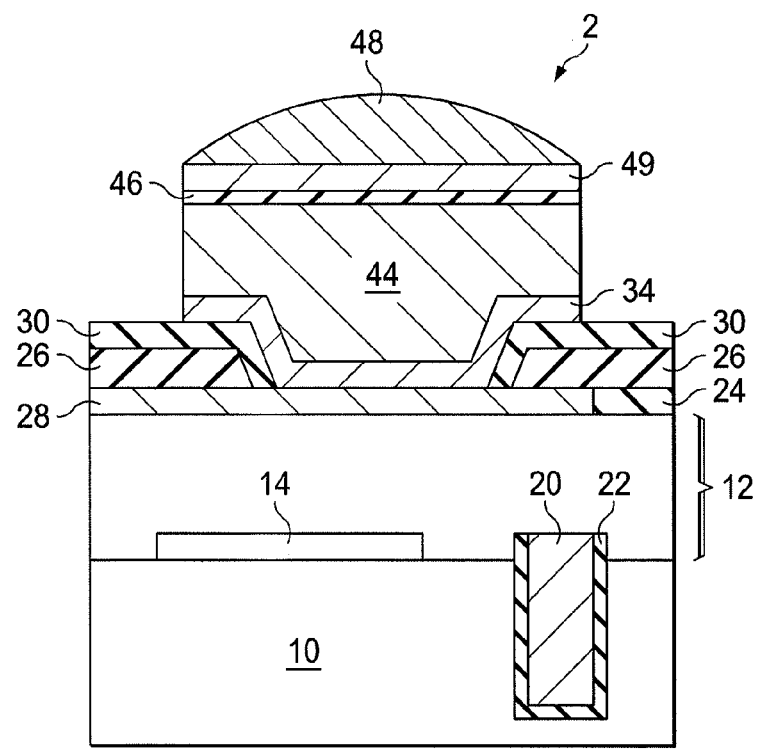

Next, as shown in FIG. 6, mask 38 is removed. As a result, the portions of UBM 34 underlying mask 38 are exposed. Referring to FIG. 7, the exposed portions of UBM 34 are removed by a flash etching. A re-flow is then performed, as shown in FIG. 8A, so that solder 48 forms a rounded top surface. In an embodiment, as shown in FIG. 8C, an intermetallic compound (IMC) layer 49 is formed between the copper post 44 and the reflowed solder 48. The IMC layer 49 may be formed between the conductive barrier layer 46 and the reflowed solder 48, in which the conductive barrier layer 46 may be partially or entirely consumed.

Conductive barrier layer 46 and solder 48 as shown in FIG. 8A may also be replaced with a metal finish. Referring to FIG. 8B, after the formation of copper post 44, mask 38 is formed.

After the removal of mask 38, metal finish 60 is formed. The formation methods of metal finish 60 include electro-chemical plating (ECP), electroless plating, and the like. In an embodiment, metal finish 60 includes tin formed of immersion. In other embodiments, metal finish 60 includes electroless nickel immersion gold (ENIG). In yet other embodiments, metal finish 60 include nickel palladium. In yet other embodiments, metal finish 60 includes electroless palladium immersion gold (ENEPIG).

Figure 9:
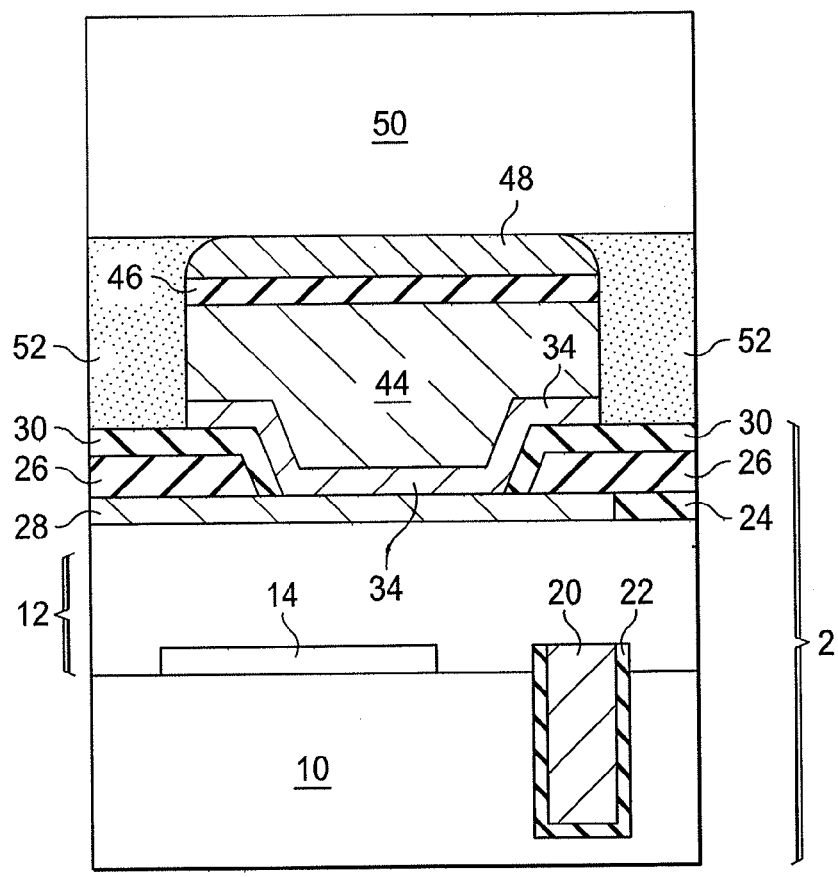

In FIG. 9, wafer 2 is mounted onto carrier wafer 50 through adhesive 52. Carrier wafer 50 may be a glass wafer. It is observed that the combined thickness of copper post 44, conductive barrier layer 46, and solder 48 may be only between about 25 µm and about 60 µm. This combined thickness is within the achievable range of the thickness of adhesive 52. Adhesive 52 may thus fully fill in the gap between carrier wafer 50 and wafer 2 without generating voids. As a result, in subsequent backside grinding and interconnect formation processes, adhesive 52 may provide maximum protection to the structure inside wafer 2.

In subsequent process steps, the backside 10b of substrate 10 is grinded, and a backside interconnect structure is formed. For an example, the details of the backside grinding and the interconnect structure formation are provided in the co-pending U.S. patent application Ser. No. 12/332,934, filed Dec. 11, 2008, and entitled "Backside Connection to TSVs Having Redistribution Lines;" and application Ser. No. 12/347,742, and entitled "Bond Pad Connection to Redistribution Lines Having Tapered Profiles," which applications are hereby incorporated herein by reference. The details are thus not repeated herein. After the formation of the backside interconnect structure, and possibly after the bonding of wafer 2 to another wafer, carrier wafer 50 may be demounted from wafer 2, followed by the removal of adhesive 52.

Figure 10:
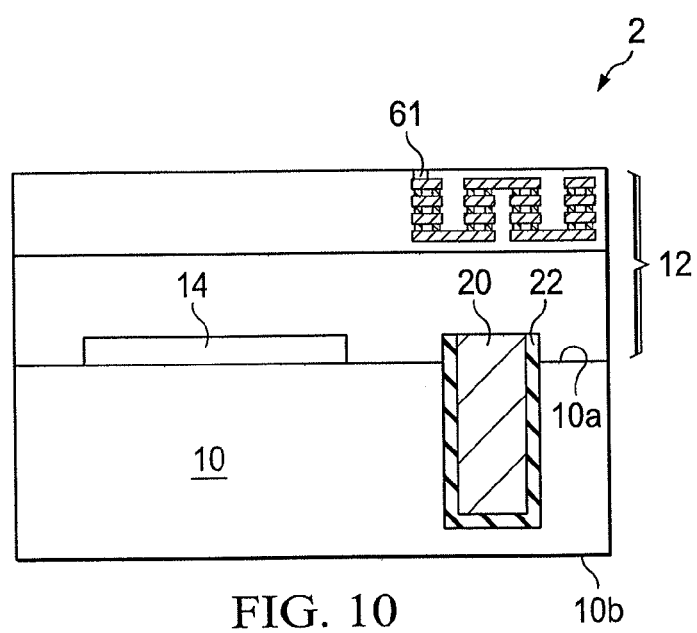
FIGS. 10 through 19B are cross-sectional views of intermediate stages in the manufacturing of a front side interconnect structure in accordance with another embodiment, wherein a post-passivation interconnect (PPI) is formed.
Figure 11:
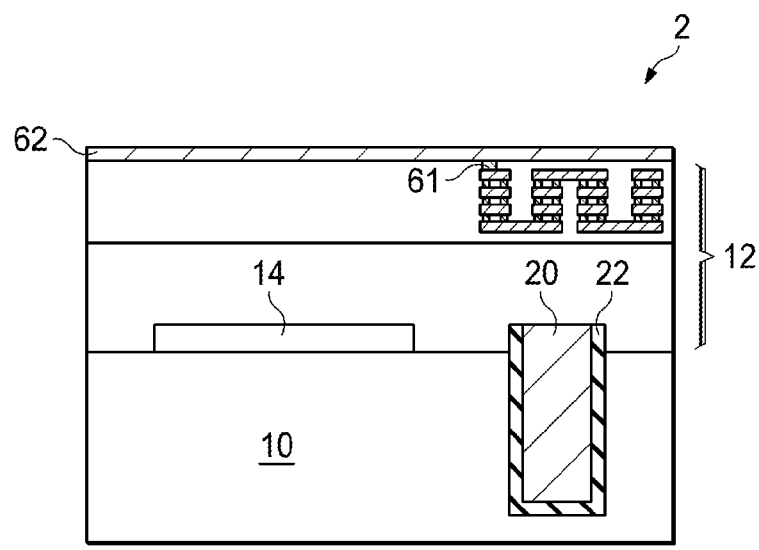

FIGS. 10 through 19B illustrate an alternative embodiment, in which post-passivation interconnect (PPI) is formed. Referring to FIG. 10, the metal lines and vias in interconnect structure 12 are illustrated. Interconnect structure 12 may include top via 61, which is exposed through the respective dielectric layer. Top via 61 may be formed in a passivation layer, which may be essentially the same as passivation layers 24 and 26 as shown in FIG. 9. Next, as shown in FIG. 11, seed layer 62 is formed. Seed layer 62 may be formed of essentially the same material as UBM 34 as shown in FIG. 3.

Figure 12:
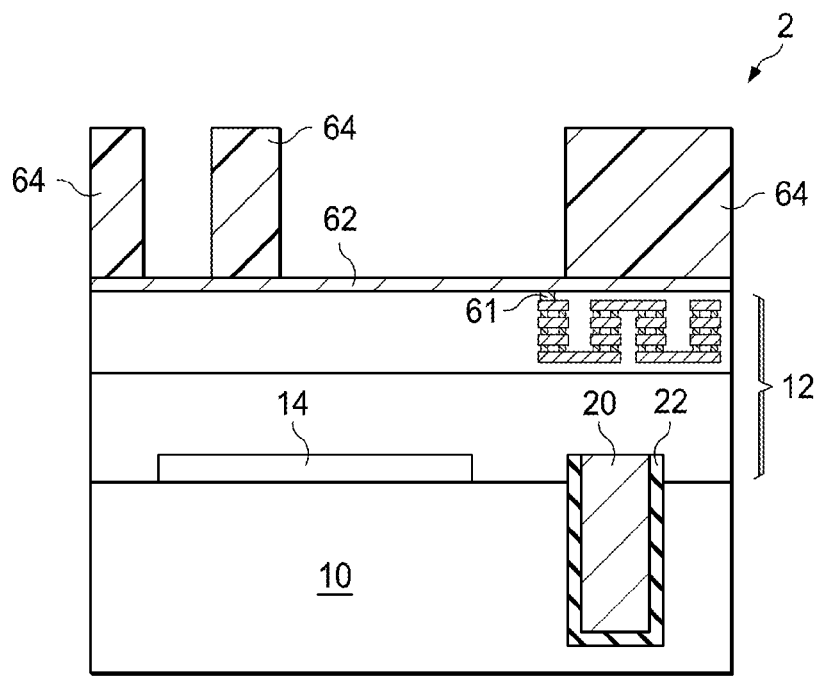
Figure 13:
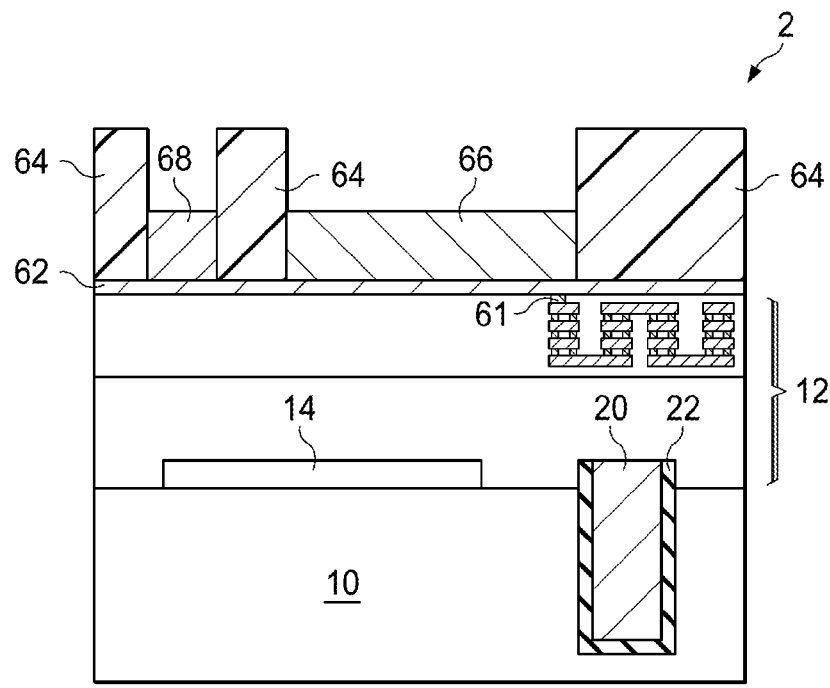

Referring to FIG. 12, mask 64 is formed, for example, using a dry film or a photo resist. In FIG. 13, PPIs 66 and 68 are formed. PPI 66 may include a metal pad, while PPI 68 may be a metal line used for routing signals. PPI 66 is connected to metal finish 60. Again, PPI 66 may be formed of copper, although other metals such as aluminum, silver, tungsten, and the like, may be used or added. The formation methods include electro or electroless plating.

Figure 14:
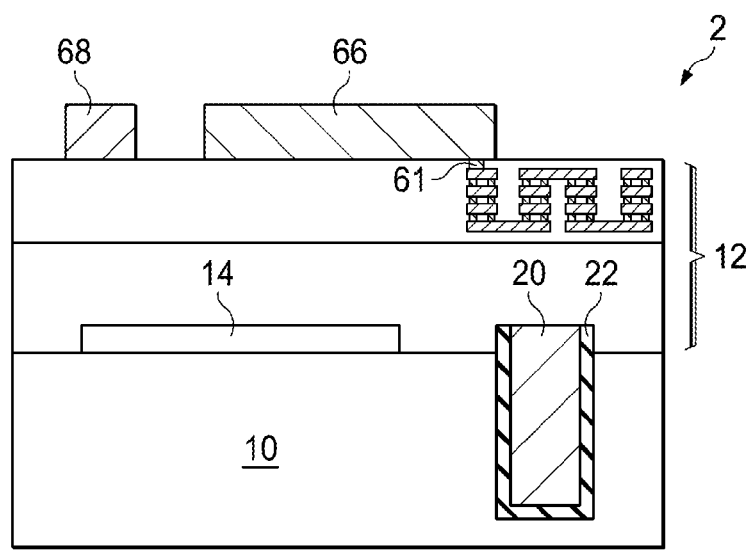

In FIG. 14, mask 64 is removed, followed by the removal of exposed portion of UBM 34. Since UBM 34 may be formed of essentially the same material as that of PPIs 66 and 68, UBM 34 appears to be merged into PPIs 66 and 68, and hence the remaining portions of UBM 34 are not shown hereinafter.

Figure 15:
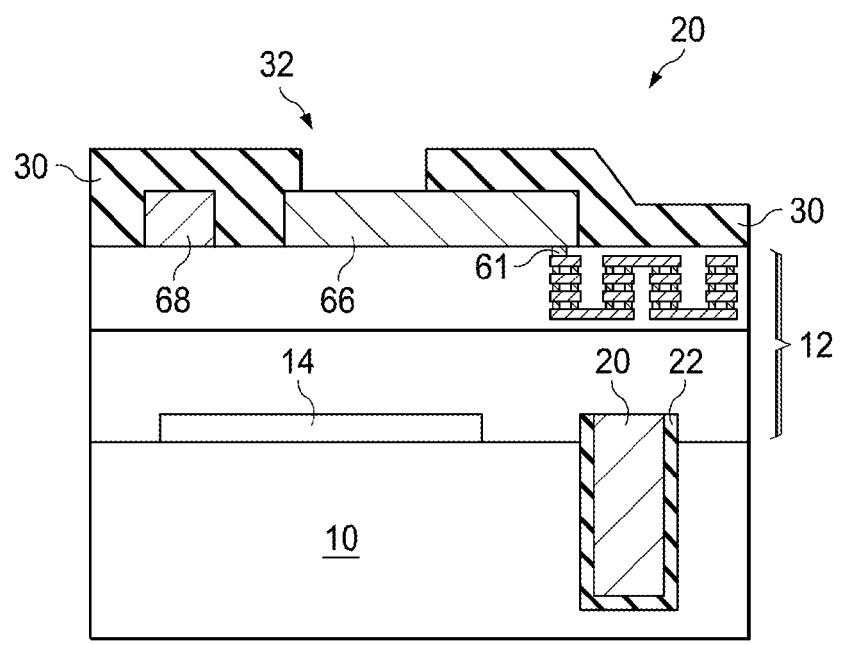
Figure 16:
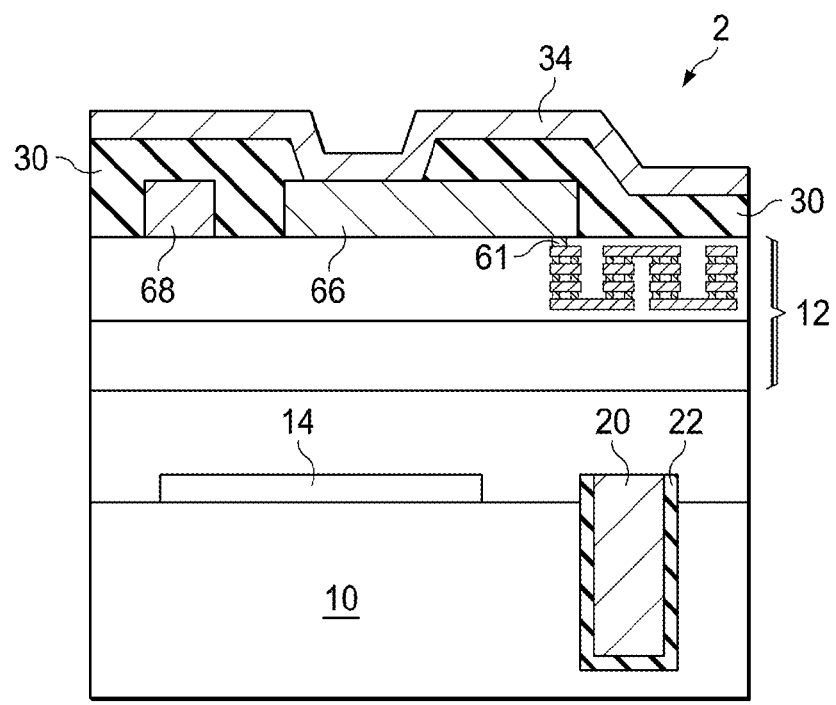
Figure 17:
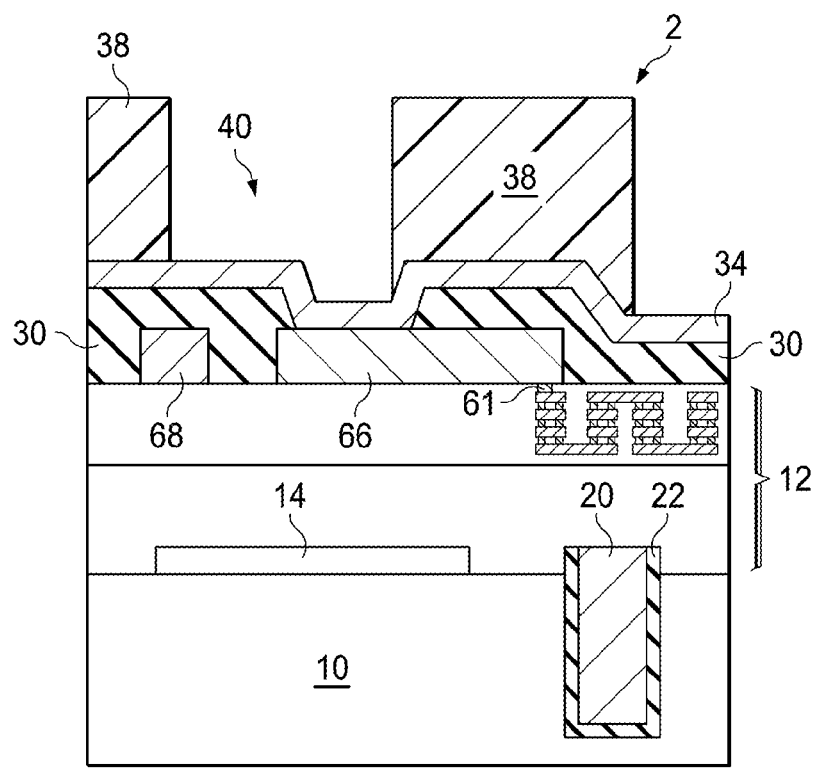
Figure 18:
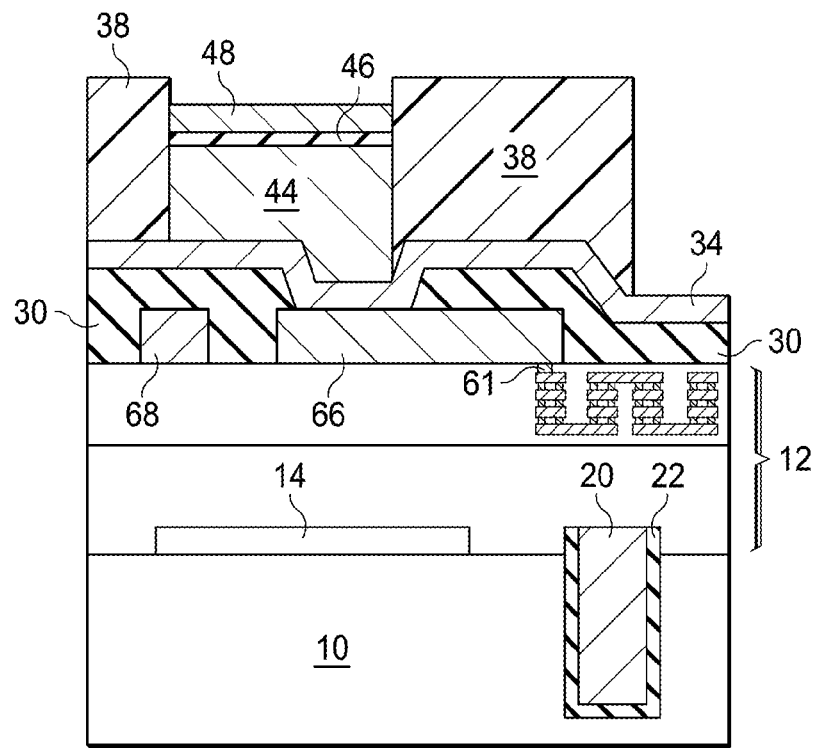
Figure 19A:
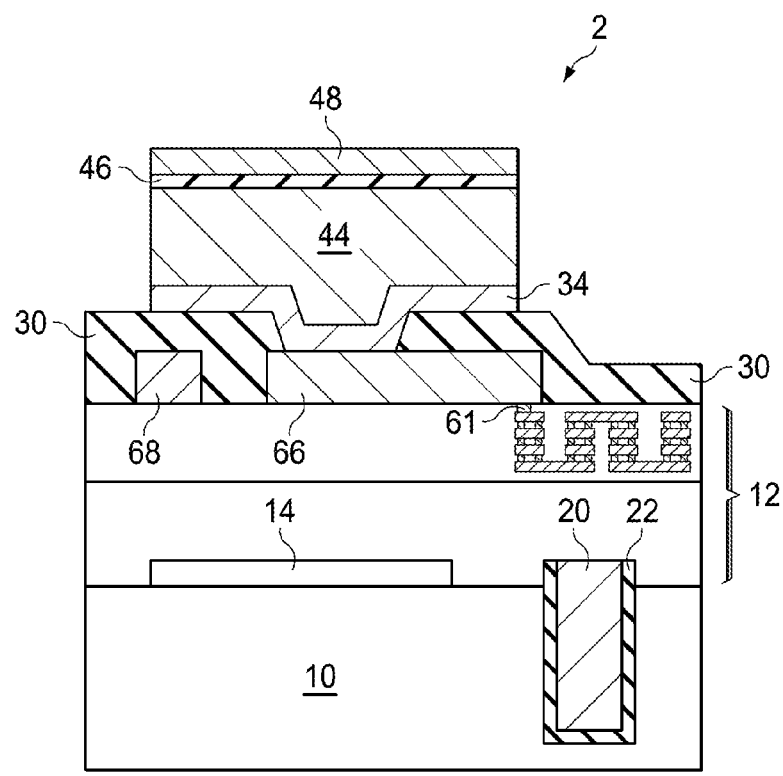
Figure 19B:
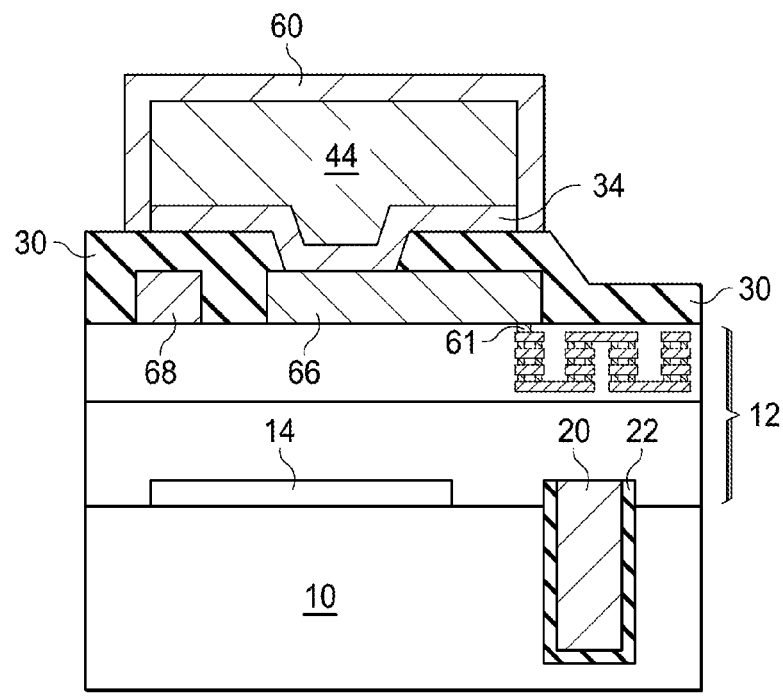

In subsequent process steps, as shown in FIGS. 15 through 19B, copper post 44, conductive barrier layer 46, and solder 48 are formed. The brief process is discussed herein, while the details may be essentially the same as in the process steps shown in FIGS. 3 through 8A. Unless specified otherwise, like elements in FIGS. 15 through 19B and in FIGS. 3 through 8A are denoted using like reference numerals. As shown in FIG. 15, dielectric buffer layer 30, which may be formed of polyimide, is formed. Opening 32 is formed in dielectric buffer layer 30 and exposing PPI 66. In FIG. 16, UBM 34 is formed. In FIG. 17, mask 38 is formed. Copper post 44, conductive barrier layer 46, and solder 48 are then formed, as shown in FIG. 18. FIG. 19A illustrates the removal of mask 38 and the exposed portion of UBM 34. FIG. 19B illustrates an alternative embodiment, in which metal finish 60 replaces conductive barrier layer 46 and solder 48.

The embodiments have several advantageous features. By forming copper posts instead of solder bumps, the thickness of the copper post may be well controlled, and can be lower than the feasible thickness of the adhesive for bonding the wafer to a carrier wafer. As a result, the internal structure in the wafer may be better protected. Further, since the copper post, the overlying solder, and the metal finish do not extend significantly sideways, it is easier to control the pitch between neighboring copper posts to less than about 150 µm. As a comparison, in existing integrated circuit structures, since solder bumps are used, the bump pitch needs to be greater than about 150 µm to avoid the shorting between neighboring solder bumps.

In accordance with one aspect of the embodiment, an integrated circuit structure includes a semiconductor substrate; a conductive via (TSV) passing through the semiconductor substrate; and a copper-containing post overlying the semiconductor substrate and electrically connected to the conductive via.

Other embodiments are also disclosed.

In an embodiment, a method of forming an integrated circuit structure is provided. The method includes providing a substrate, the substrate having one or more metallization layers formed thereon and one or more conductive vias extending into the substrate. One or more passivation layers are formed over the one or more metallization layers, and a post-passivation interconnect (PPI), including a conductive pad, are formed over the one or more passivation layers. A dielectric buffer layer is formed over at least a portion of the conductive pad, and an under-bump-metallurgy (UBM) is formed directly coupled to the conductive pad, wherein the UBM extends over at least a portion of the dielectric buffer layer. Thereafter, a conductive pillar is formed over the UBM, and one or more conductive materials is formed over the conductive pillar.

In another embodiment, a method of forming an integrated circuit structure is provided. The method includes providing a substrate, wherein the substrate has a post-passivation interconnect (PPI) formed thereon. A conductive pillar is formed such that the conductive pillar is in electrical contact with the PPI, and one or more conductive materials are formed over the conductive pillar, wherein a combined height of the conductive pillar and the one or more conductive materials is between about 25 µm and about 60 µm.

In yet another embodiment, a method of forming an integrated circuit structure is provided. The method includes providing a substrate, wherein the substrate includes a conductive pillar formed thereon and one or more conductive materials formed over the conductive pillar. The substrate is attached to a carrier substrate using an adhesive, such that the adhesive fully fills a gap between the substrate and the carrier substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the embodiments.

What is claimed is:

1. A method of forming an integrated circuit structure, the method comprising:
   providing a substrate, the substrate having one or more metallization layers thereon and one or more conductive vias extending into the substrate;
   forming one or more passivation layers over the one or more metallization layers;
   forming a post-passivation interconnect (PPI) over the one or more passivation layers, the PPI comprising a conductive pad;
   forming a dielectric buffer layer over at least a portion of the conductive pad;
   forming an under-bump-metallurgy (UBM) directly coupled to the conductive pad, the UBM extending over at least a portion of the dielectric buffer layer;
   forming a conductive pillar over the UBM;
   forming one or more conductive materials over the conductive pillar; and
   attaching the substrate to a carrier substrate using an adhesive, the adhesive contacting a sidewall of the conductive pillar and extending between the conductive pillar and an adjacent conductive pillar.

2. The method of claim 1, wherein the adhesive fully fills a gap between the substrate and the carrier substrate.

3. The method of claim 2, wherein the one or more conductive materials comprises a solder material, and further comprising, prior to the attaching, performing a reflow process.

4. The method of claim 1, wherein a combined thickness of the conductive pillar and the one or more conductive materials is between about 25 µm and about 60 µm.

5. The method of claim 1, wherein the forming one or more conductive materials comprises forming a conductive finish over a top surface and sidewalls of the conductive pillar.

6. The method of claim 1, wherein the forming one or more conductive materials comprises forming a conductive cap layer over the conductive pillar and a solder material over the conductive cap layer.

7. The method of claim 1, wherein the conductive pillar comprises a copper-containing material.

8. The method of claim 1, wherein the forming the UBM and the forming the conductive pillar comprises:
   forming a conductive UBM layer over the dielectric buffer layer;
   forming a patterned mask over the conductive UBM layer, the patterned mask having an opening;
   forming the conductive pillar in the opening over a portion of the UBM layer;
   removing the patterned mask; and
   removing exposed portions of the UBM layer using the conductive pillar as a mask, remaining portions of the UBM layer forming the UBM.

9. A method of forming an integrated circuit structure comprising:
- providing a substrate, the substrate having a post-passivation interconnect (PPI) formed thereon;
- forming a conductive pillar in electrical contact with the PPI;
- forming one or more conductive materials over the conductive pillar, a combined height of the conductive pillar and the one or more conductive materials being between about 25 μm and about 60 μm;
- forming an adhesive extending along a sidewall of the conductive pillar; and
- attaching the substrate to a carrier wafer using the adhesive, the conductive pillar and the adhesive being interposed between the substrate and the carrier wafer.

10. The method of claim 9, wherein the forming one or more conductive materials comprises:
- forming a conductive barrier layer over the conductive pillar; and
- forming a solder material over the conductive barrier layer.

11. The method of claim 9, wherein the forming the one or more conductive materials comprises forming a conductive finish over a top surface and sidewalls of the conductive pillar.

12. The method of claim 9, further comprising attaching the substrate to a carrier substrate using an adhesive.

13. The method of claim 12, wherein the adhesive fills a gap between the substrate and the carrier substrate.

14. A method of forming an integrated circuit structure comprising:
- providing a substrate, the substrate having a plurality of conductive pillars formed thereon and one or more conductive materials over each of the conductive pillars, the plurality of conductive pillars comprising a first conductive pillar and a second conductive pillar; and
- attaching the substrate to a carrier substrate using an adhesive, the adhesive filling a gap between the substrate and the carrier substrate, the adhesive being interposed between and extending along sidewalls of the first conductive pillar and the second conductive pillar.

15. The method of claim 14, wherein the providing the one or more conductive materials over the conductive pillar comprises:
- forming a conductive barrier layer over the conductive pillar;
- forming a solder material over the conductive barrier layer; and
- reflowing the solder material.

16. The method of claim 15, wherein the reflowing the solder material is performed prior to the attaching the substrate to the carrier substrate.

17. The method of claim 14, wherein the providing the one or more conductive materials over the conductive pillar comprises forming a conductive finish over a top surface and sidewalls of the conductive pillar.

18. The method of claim 14, wherein a combined thickness of the conductive pillar and the one or more conductive materials is between about 25 μm and about 60 μm.

19. The method of claim 14, wherein the conductive pillar comprises a copper-containing material.

20. The method of claim 10, further comprising reflowing the solder material.

* * * * *